United States Patent [19]

Tuan et al.

[11] 4,262,298
[45] Apr. 14, 1981

[54] RAM HAVING A STABILIZED SUBSTRATE BIAS AND LOW-THRESHOLD NARROW-WIDTH TRANSFER GATES

[75] Inventors: Hsing T. Tuan, Poway; Donald L. Henderson, Sr., Encinitas; Robert N. Ruth, Jr., Poway, all of Calif.

[73] Assignee: Burroughs Corporation, Detroit, Mich.

[21] Appl. No.: 72,446

[22] Filed: Sep. 4, 1979

[51] Int. Cl.³ .......................................... H01L 27/02
[52] U.S. Cl. ...................................... 357/41; 357/23; 357/55; 357/52
[58] Field of Search ...................... 357/23, 41, 55, 52

[56] References Cited

U.S. PATENT DOCUMENTS

| | | | |
|---|---|---|---|
| 4,141,027 | 2/1979 | Baldwin | 357/51 |
| 4,145,233 | 3/1979 | Sefick | 148/1.5 |
| 4,158,238 | 6/1979 | Erb | 365/182 |
| 4,183,040 | 1/1980 | Rideout | 357/41 |
| 4,184,085 | 1/1980 | Takahashi | 307/238 |
| 4,203,125 | 5/1980 | Chatterjee | 357/41 |

Primary Examiner—Martin H. Edlow
Attorney, Agent, or Firm—Charles J. Fassbender; Kevin R. Peterson

[57] ABSTRACT

Disclosed is a RAM that includes a semiconductor substrate having P-type dopant impurity atoms and having a major surface. A plurality of spaced apart regions of N-type atoms lie within a predetermined area on the surface to define storage regions for the cells of the memory. An insulating layer of substantially uniform thickness with a conductive layer lying thereon completely covers the predetermined area except for a plurality of elongated openings which extend outward from each of the storage regions. A layer of P-type dopant atoms lie at substantially the same level as the storage regions throughout that portion of the substrate that is beneath the insulating layer. By this structure, the perimeter of a transfer gate that exhibits essentially no narrow channel width effect is defined from each storage region by the respective openings. Also, a capacitor for stabilizing the bias voltage of the substrate is formed by the combination of that portion of the insulating layer and conductive layer which lies between the storage regions.

20 Claims, 10 Drawing Figures

RAM HAVING A STABILIZED SUBSTRATE BIAS AND LOW-THRESHOLD NARROW-WIDTH TRANSFER GATES

BACKGROUND OF THE INVENTION

This invention relates to semiconductor memories, and more particularly to metal-oxide-silicon dynamic storage random access memories. For convenience, the latter are hereinafter referred to simply as RAM's.

Basically, a typical RAM contains a plurality of spaced apart charge storage regions which are interconnected via respective transfer gates to a plurality of bit lines. The storage regions, the transfer gates, and the bit lines are all fabricated on one surface of a semiconductor chip. To write data into and read data from a particular storage area, the corresponding transfer gate is selectively enabled.

Over the past several years, the number of storage regions per RAM chip has continually increased. Early RAM chips contained only 64 storage areas; whereas present day RAM chips contain up to 65K storage areas. Several factors have contributed to this achievement. However, a major factor has been the development of techniques for decreasing the dimensions of the various RAM components.

One phenomenon, however, which limits how far those dimensions can be shrunk is called "narrow channel width effect". From a functional point of view, the "narrow channel width effect" shows up as an increase in the threshold voltage level of the transfer devices as their channel width is decreased. This phenomenon begins to occur when the channel width is about 3-4 microns for reasonable substrate concentrations, such as $10^{15}$ for example. Then as the channel width is decreased further, the threshold voltage increases at an exponential rate.

Mathematically, the threshold voltage may be expressed as $V_t = V_{to} + \gamma(\sqrt{V_{BS} + 2\phi_F} - \sqrt{2\phi_F})$. In this equation, $\gamma$ is a parameter which increases exponentially as the channel width decreases below about 3-4 microns. The other terms are relatively constant and are defined as follows: $V_{to}$ equals threshold voltage with zero substrate bias, $V_{BS}$ equals substrate to source bias, and $\phi_F$ equals the Fermi level.

Clearly, an upper limit for $V_t$ exists beyond which the memory simply won't operate. As $V_t$ increases, the amount of charge that can be written into a storage region decreases. And eventually, the amount of charge becomes so small that it cannot be detected. A problem then is how to narrow the width of the channel beyond 3-4 microns in the memory's transfer devices and at the same time not raise $\gamma$.

Another phenomenon which limits how far the RAM's dimensions can be shrunk is parasitic capacitive coupling from the bit lines to the substrate. This capacitance is alway present. It is due, for example, to a P-N junction that is formed between diffused N+ bit line in a P-type substrate. Some memories have polysilicon or metal bit lines that lie on insulating layers above the substrate, which lowers the bit line to substrate coupling capacitance, but does not eliminate it.

From an A-C circuits viewpoint, the bit line capacitance is in series with two storage capacitances that purposely exist. One of the storage capacitances is formed by the interface between the substrate and storage regions. And the other storage capacitance is formed by the interface between the storage region and overlying field plate. These storage capacitors are formed to hold charge (which represents either a "1" or a "1") in the memory.

However, due to the parasitic bit line capacitance, the information in the storage regions is altered as the bit lines are precharged prior to the reading of a cell. For example, suppose that 0 volts is initially stored in the cell, and that the bit lines are subsequently precharged from 0 volts to 5 volts. This 5 volt rise on the bit lines is divided among the above described three capacitors; which in turn changes the voltage that is stored in the cell to some higher level. Consequently, the originally stored 0 volts more difficult to detect.

One way in which this problem has been handled in the smaller memories of the past was to provide an external pin on each memory chip that connects to the chip substrate. Then, in a operating system, that pin was connected to an external voltage source which was insensitive to voltage changes on the bit lines. However, modern memory chips have a large number of memory cells, and consequently they require a large number of pins for receiving signals to address the cells. Thus, present day 65K memories include no separate pin for biasing the substrate from an external supply. Instead, the substrate is biased with a voltage that is created internal to the chip which will fluxuate as described above when the bit lines are precharged.

Therefore, a primary object of the invention is to provide an improved RAM.

Another object of the invention is to provide a RAM having transfer devices of less than 3-4 micron width that exhibit greatly reduced narrow channel width effect.

Still another object of the invention is to provide a RAM having a substrate which is biased by an on chip voltage source and which is insensitive to voltage changes on the bit lines due to capacitive coupling.

BRIEF SUMMARY OF THE INVENTION

These and other objects are accomplished by a RAM that includes a semiconductor substrate having P-type dopant impurity atoms and having a major surface. A plurality of spaced apart regions of N-type atoms lie within a predetermined area on the surface to define storage regions for the cells of the memory. An insulating layer of substantially uniform thickness with a conductive layer lying thereon completely covers the predetermined area except for a plurality of elongated openings which extend outward from each of the storage regions. A layer of P-type dopant atoms lie at substantially the same level as the storage regions throughout that portion of the substrate that is beneath the insulating layer. By this structure, the perimeter of a transfer gate that exhibits essentially no narrow channel width effect is defined from each storage region by the respective openings. Also, a capacitor for stabilizing the bias voltage of the substrate is formed by the combination of that portion of the insulating layer and conductive layer which lies between the storage regions.

BRIEF DESCRIPTION OF THE DRAWINGS

The various features and advantages of the invention will best be understood by reference to the following Detailed Description and accompanying drawings wherein.

DETAILED DESCRIPTION

Figure 2:
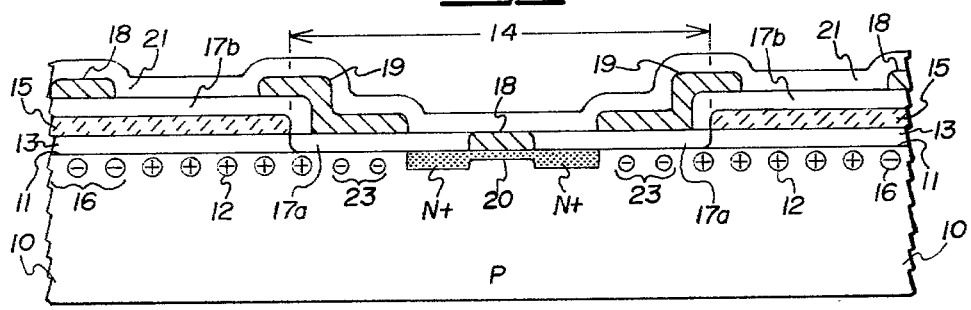
FIG. 2 is a cross-sectional view taken along lines 2—2 in FIG. 1.
Figure 3:
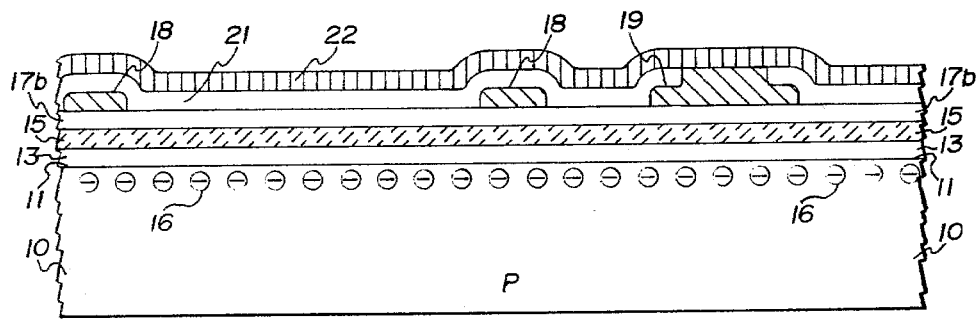
FIG. 3 is a cross-sectional view taken along lines 3—3 in FIG. 1.

One preferred embodiment of the invention will now be described in conjunction with FIGS. 1, 2, and 3. This embodiment includes a P-type semiconductor substrate having a substantially flat surface 11. A plurality of spaced apart regions 12 of N-type dopant atoms are disposed in substrate 10 near surface 11 within a predetermined area thereof. They define the storage regions for the cells of the memory.

An insulating layer 13 lies on surface 11 throughout the predetermined area except for a plurality of elongated openings 14 that extend outward from each of the storage regions. This insulating layer is of a substantially uniform thickness over both the storage regions 12 and the spaces which lie therebetween. Preferably, insulating layer 13 is relatively thin, such as 300–500 Å. A conductive layer 15 completely covers the top surface of insulating layer 13. Suitably, conductive layer 15 consists of heavily doped polysilicon and is about 3,000 Å thick.

Lying throughout that portion of substrate 10 which is covered by insulating layer 13 and conductive layer 15 is a layer of P-type dopant impurity atoms 16. These P-type atoms lie at substantially the same level as the N-type atoms in storage regions 12; and their concentrations are such that regions 12 remain N-type with layer 16 superimposed thereon. For example, the surface density of the N-type atoms in region 12 and the P-type atoms in region 16 respectively may be $5 \times 10^{17} - 1 \times 10^{19}$ atoms/CM$^3$ and $5 \times 10^{15} - 1 \times 10^{17}$ atoms/CM$^3$.

One important feature of the above structure is that the entire portion of insulating layer 13 and the overlying conductive layer 15 which lie between storage regions 12 form a capacitor to substrate 10. And this capacitor operates to stabilize the voltage that is stored in the charge storage regions 12. This will be described in greater detail in conjunction with FIGS. 4 and 5.

Another important feature of the above structure is that it enables very narrow transfer gates to be fabricated from each of the storage regions 12. Specifically, the transfer devices may be fabricated with a channel width of less than 3 microns without an exponential increase in their threshold voltage. This will be described in greater detail in conjunction with FIGS. 6 and 7.

Figure 1:
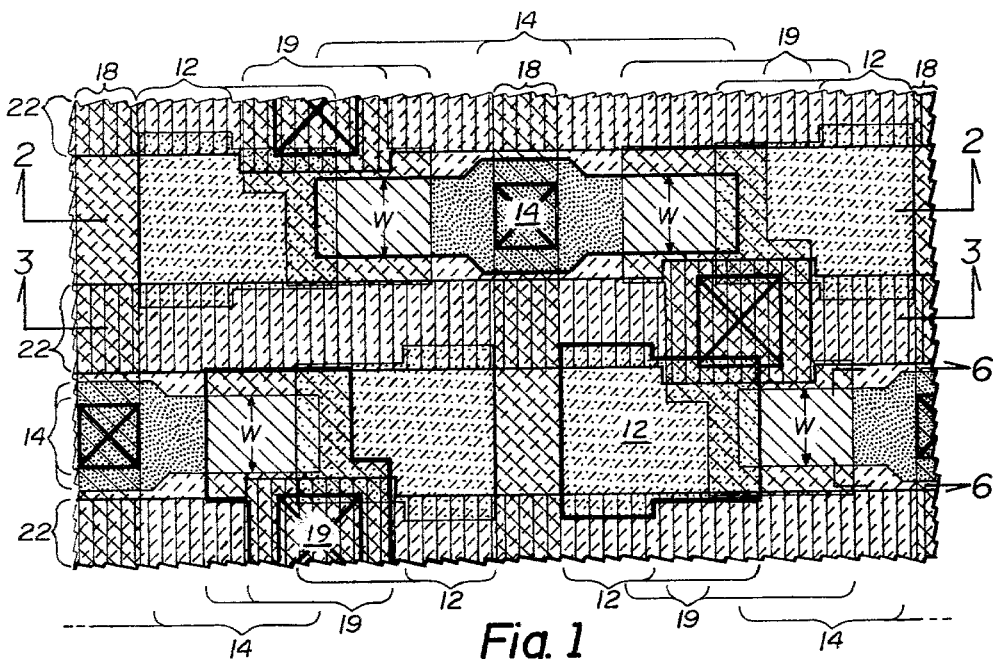
FIG. 1 is a plan view of a first embodiment of the invention.

The remaining components of the FIG. 1 embodiment include an insulating layer 17a which covers surface 11 within opening 14; and an insulating layer 17b which covers conductive layer 15. Preferably, layer 17a is substantially thinner than layer 17b. For example, layer 17a may suitably be 300–900 Å; whereas layer 17b may suitably be 2,500–6,000 Å.

A patterned conductive layer lies on insulating layers 17a and 17b. It forms a plurality of bit lines 18, and a plurality of transfer gates 19. These transfer gates have a width W which is defined by the perimeter of the openings 14.

A buried contact 20 provides a conductive path from the bit lines 18 to an N+ region which is formed by a diffusion. The entire structure is then covered with another insulating layer 21. And word lines 22 are disposed thereon to selectively interconnect the transfer gates 19.

Preferably, a P-type implant 23 is also included in that portion of substrate 10 which lies within opening 14 under transfer gate 19. Implant 23 is of lower density than dopant layer 16. It is provided to raise the threshold of the transfer device to ensure they completely turn off.

Suitably, implant 23 may be fabricated by forming layer 16 throughout opening 14 as well as under insulating layer 13, and by superimposing an N-type implant in that portion of layer 16 which lies beneath the opening. Alternatively, implant 23 may be formed by excluding dopant layer 16 from that portion of substrate 10 which lies beneath opening 14, and by separately implanting that portion of the substrate with P-type atoms.

Figure 4:
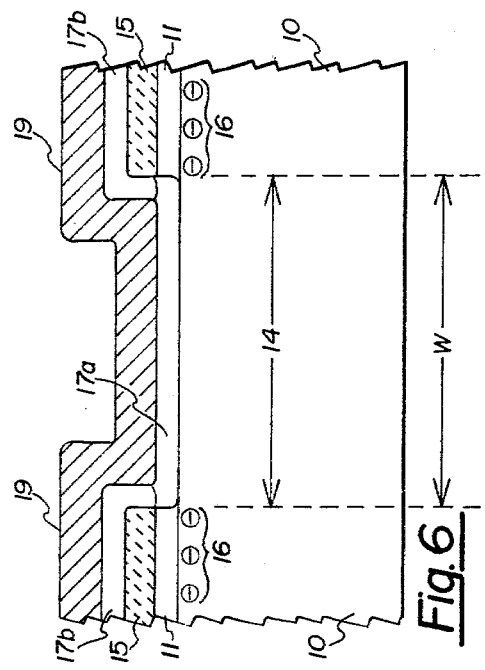
FIG. 4 is an A-C equivalent circuit diagram for one memory cell of the FIG. 1 embodiment.
Figure 5:
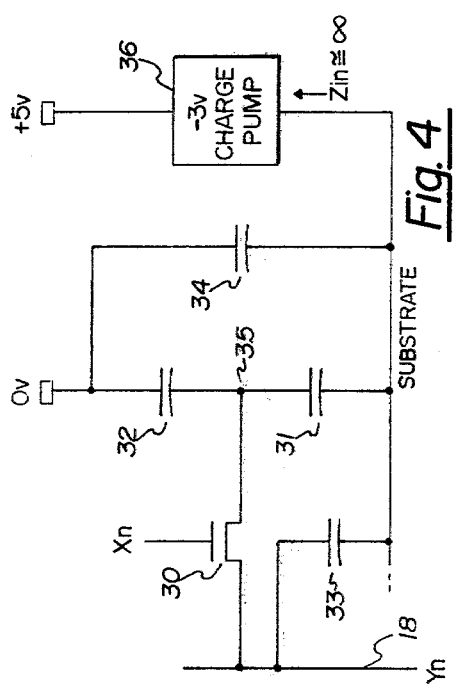
FIG. 5 is a timing diagram illustrating the operation of the FIG. 4 circuit.

Referring now to FIGS. 4 and 5, the details of the aforementioned capacitor for stabilizing the voltage between substrate 10 and storage regions 12 will be described. In FIG. 4, transistor 30 is formed by transfer gate 19 and the underlying insulating layer 17a. Capacitor 31 is formed by the junction between storage regions 12 and the underlying substrate 10. Capacitor 32 is formed by that portion of insulating layer 13 and conductor 15 which directly overly storage regions 12. And capacitor 33 is formed by the junction between the buried contact diffusions 20 and substrate 10.

All of the components 30, 31, 32, and 33 are included not only in the memory of FIG. 1, but are also included in prior art memories. However, the memory structure of FIG. 1 further includes an additional capacitor 34 which is not present in prior art memories. It is formed by that portion of conductive layer 15, insulating layer 13, and substrate 10 which lie between the storage regions 12. From a circuits viewpoint, capacitor 34 is in parallel with capacitors 31 and 32.

The significance of capacitor 34 is that it operates to stabilize the voltage at node 35, which is the storage node of the memory cell, as the voltage on the bit lines 18 switches from 0 to 5 volts during a read operation. Without capacitor 34, that 5 volt change is first coupled to substrate 10 through capacitor 33; and from there, it is coupled to node 35 through capacitor 31.

Note that the substrate in the FIG. 4 circuit is not directly biased by an external supply voltage. Instead, the substrate bias voltage is formed by a circuit 36 that exists on the memory chip. This is the standard architecture for presently existing 65K RAM memories. And since circuit 36 must be small enough to fit on the memory chip, it cannot have the same drive as an external supply which would be insensitive to voltage changes on the bit lines 18. In fact, the A-C equivalent circuit of circuit 36 may approximate an open circuit.

Without capacitor 34, the change in substrate voltage that results from a 5 volt rise on the bit lines may be expressed mathematically as follows:

$$\Delta V_{SUB} = \frac{5 \times C_{BL}}{C_{BL} + C_{SER} + C_{PSD}} \qquad \text{eq 1}$$

In this equation, $\Delta V_{SUB}$ is the change in substrate voltage; $C_{BL}$ is the bit line capacitor for half of all the bit lines in the entire memory; $C_{SER}$ is the equivalent capacitance for series combination of capacitors 31 and 32 for all the cells in the entire memory; and $C_{PSD}$ is the capacitance of any power supply busses that are diffused in the periphery portion of the memory to connect with various circuits such as inverters and decoders. Only half of the total bit lines are used above since prior to the precharging operation, the other bit lines are already at 5 volts.

Using equation 1, the corresponding rise in voltage at node 35 may be written as:

$$\Delta V_{35} = \Delta V_{SUB} \left[ \frac{C_{SCPN}}{C_{SCPN} + C_{SCOX}} \right] \qquad \text{eq 2}$$

In this equation, $V_{35}$ is the change in voltage at node 35; $C_{SCPN}$ is capacitor 31 times the number of cells in the memory; and $C_{SCOX}$ is capacitor 32 times the number of cells in the memory.

By comparison, with capacitor 34 in place, the change in substrate voltage that results from a 5 volt rise on the bit lines equals:

$$\Delta V_{SUB} = \frac{5 \times C_{BL}}{C_{BL} + C_{SER} + C_{PSD} + C_{STAB}} \qquad \text{eq 3}$$

All of the terms in equation 3 are defined above except for $C_{STAB}$. It equals capacitor 34 times the number of cells in the memory. The corresponding change in the voltage at node 35 is calculated by using equation 2.

Some representative values for each of the terms in equations 1, 2, and 3 for a typical 65K RAM are as follows:

$C_{OX} = (31.5 \times 10^{-15} \text{ farads/cell}) \times (65,536 \text{ cells}) = 2064 \text{ pf}$ $C_{SCPN} = (3.6 \times 10^{-15} \text{ farads/cell}) \times (65,536 \text{ cells}) = 236 \text{ pf}$ $C_{SER} = 212 \text{ pf}$ $C_{BL} = (0.6 \text{ pf/bit line}) \times (512 \text{ bit line}) = 307 \text{ pf}$ $C_{PSD} = 150 \text{ pf}$ These values will, of course, vary somewhat depending upon the doping levels, oxide thickness, etc. of a particular memory. But they are sufficiently representative to illustrate the operation of this invention. Also, the value of $C_{STAB}$ will vary in a similar fashion. But a representative value for it is:

$C_{STAB} = (57.6 \text{ ff/cell}) \times (65,536) = 3775 \text{ pf}$

Substituting the above values into equations 1, 2, and 3 yields the following results:

$\Delta V_{SUB}$ for a conventional RAM equals 2.29 volts
$\Delta V_{35}$ for a conventional RAM equals 235 millivolts
$\Delta V_{SUB}$ for the disclosed RAM equals 0.34 volts
$\Delta V_{35}$ for the disclosed RAM equals 35 millivolts Thus it can be seen that the substrate voltage stays nearly constant with capacitor 34 in place. This in turn makes the information voltage that is stored at node 35 easier to sense. But by comparison, the substrate voltage varies considerably in conventional memories wherein capacitor 34 does not exist. This makes the information voltage very difficult to sense and can cause read errors.

To further clarify this point, consider now the waveforms of FIG. 5. In that FIG., voltage is plotted on the vertical axis, and time is plotted on the horizontal axis. At time t0, the bit line that connects to the cell that is to be read is precharged to 5 volts. This is illustrated by waveform 40. At the same time, a bit line which connects to a dummy cell is also precharged to 5 volts. This is illustrated by waveform 41.

Due to the above described capacitive coupling, the voltage at node 35 in the memory cell which is to be read will also rise if capacitor 34 does not exist. This is illustrated by waveform 42. However, with capacitor 34 in place, the voltage at node 35 remains stable as illustrated by waveform 43.

Subsequently at time t1, the voltage at node 35 is sensed. To that end, the transfer gates of the selected cell and the dummy cell are turned on. If the selected cell has 5 volts (or more due to capacitive coupling) stored therein, then the bit line voltage stays at the precharge level as illustrated by waveform 40a. But if the selected cell has 0 volts stored therein, then the bit line voltage drops from the precharge level as illustrated by waveform 40b.

Preferably, the difference between the voltage level of waveforms 40a and 40b is as large as possible so that they can be easily distinguished from each other. However, as the zero volt level on node 35 rises due to capacitive coupling, the voltage level of the bit line during sensing also rises as indicated by waveform 40c. Thus it becomes more difficult to distinguish a "1" from a "0"—which requires using the dummy cell to generate a reference voltage level 41a that lies between the two possible bit line voltages of the selected cell.

Typically, the difference between voltage levels 40a and 40b is only 150 millivolts. Thus if the reference voltage level 41a is made to lie midway therebetween, then only 75 millivolts of margin exist between it and level 40b. In the past however, the reference voltage level 41a has been made to lie closer to level 40b than to level 40a. This is because leakage current, which is thermally generated, operates to move level 40a toward zero volts. This is why the memory must be periodically refreshed. But moving the reference voltage level 41a toward level 40b aggravates the above described capacitive coupling problem, and detracts from the 75 millivolt margin. This further increases the importance of the present invention.

It should also be pointed out that the present invention is very significant in a high capacity (Hi-C) RAM, an embodiment of which will be described in conjunction with FIGS. 9 and 10. In the Hi-C version, capacitance $C_{SCPN}$ increases by a factor of three or four. This is desirable because it increases the charge storage capacity per cell; but it is undesirable because it also increases the capacitive coupling of any substrate voltage charge to the storage node as expressed by equation 2. Thus the presence of $C_{STAB}$ is very attractive in a Hi-C RAM to compensate for this increase coupling to the storage node.

In addition, it should be emphasized that $C_{STAB}$ is implemented in the present invention without any increase in chip area. $C_{STAB}$ simply utilizes the the space between the storage regions 12. In conventional RAM's, an array of memory cells occupies approximately 50% of the entire chip, and about half of that space is needed just to keep the cells separated. Thus in this invention, $C_{STAB}$ occupies about 25% of the entire chip area. And, to allocate such a large area in the peripheral portion of the chip to fabricate a separate capacitor for stabilizing the substrate voltage would be impractical.

Figure 6:
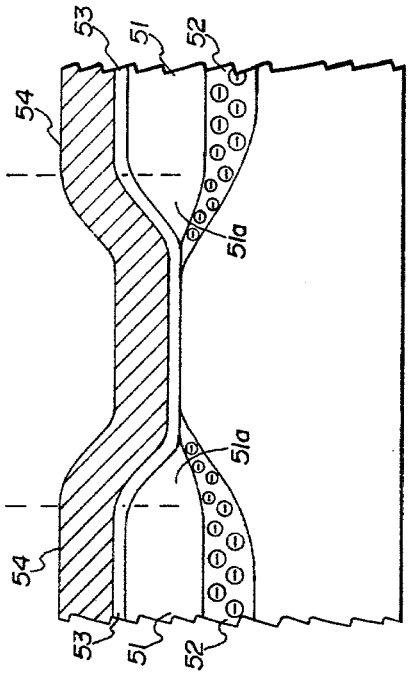
FIG. 6 is a greatly enlarged cross-sectional view taken along lines 6—6 in FIG. 1.
Figure 7:
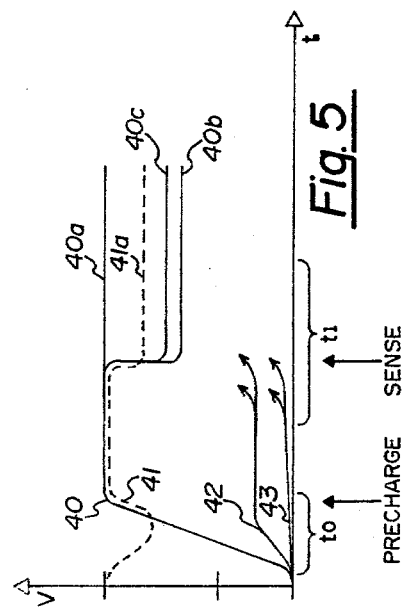
FIG. 7 is a cross-sectional view taken through the charge transfer channel in a conventional memory.

Referring now to FIGS. 6 and 7, the manner in which the disclosed memory substantially eliminates narrow channel width effect from occurring in the transfer gates to the storage regions will be described. To begin, note that all of the components in FIG. 6 have been described above as indicated by their reference numerals. That structure is to be compared with the structure of the conventional transfer gate of FIG. 7 which exhibits narrow channel width effect.

In the conventional transfer gate, the width of the channel is defined by a thick field oxide layer 51 and a high density underlying field implant 52. Typically, the field oxide is 5,000-10,000 Å thick; and the density of the field implant is $5 \times 10^{15}$ -$4 \times 10^{16}$ atoms/CM$^3$. An insulating layer 53, that covers the channel, is much thinner which permits the gate to be turned on. Typically, insulating layer 53 is 400-800 Å thick. Lying on insulating layer 53 is a transfer gate 54.

Due to the thickness of field oxide 51, its perimeter cannot be fabricated with a vertical edge. Instead, the perimeter gradually tapers off with a "birdbeak shape" as indicated via reference numeral 51a. This birdbeak is undesirable because it operates to narrow the width W of the transfer channel.

In addition, the width of the transfer channel is further reduced by lateral diffusion of field implant 52. This diffusion occurs during all high temperature steps while the memory is being fabricated. For example, it may occur as the field oxide 51 is being grown.

When the transfer channels from the storage regions are fabricated with relatively large widths, such as 4 microns or larger, then the extent to which the above described birdbeak and field implant diffusion decrease the channel width W is relatively insignificant. However, as the channel width decreases beyond 4 microns, the birdbeak and lateral diffusion operates to substantially decrease the effective channel width. And these two factors contribute significantly to the exponential increase in the devices threshold voltage level.

Further, it is important to realize that in a RAM, these two factors cannot be compensated for simply by increasing the initial layout width of the channel. This is because any increase in channel width detracts from the space that is available for the surrounding storage regions of the memory. And this in turn decreases the storage capacity of each cell which makes the signals stored therein more difficult to detect.

But these problems are essentially eliminated in the disclosed memory. There, the width W of the transfer channel is precisely defined by a nearly vertical edge of the openings 14 in the conductive layer 15 and the thin insulating layer 11. As can be seen in FIG. 6, this opening is not surrounded by any field oxide or any field implant.

Figure 8:
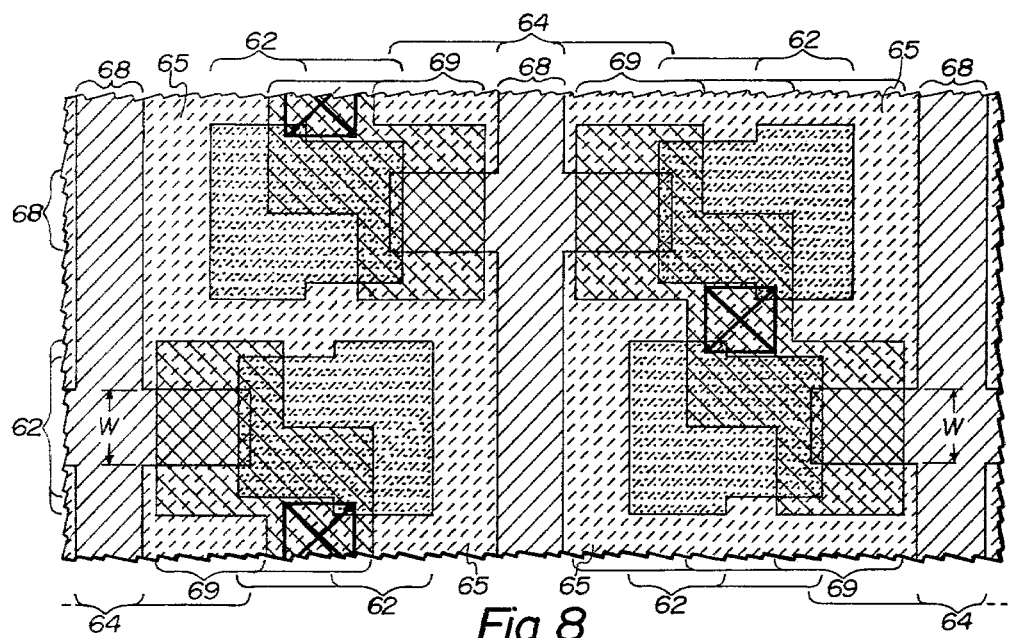
FIG. 8 is a plan view of a diffused bit line version of the FIG. 1 embodiment.

Referring now to FIG. 8, a second embodiment of the invention will be described. The components of this second embodiment that are similar in structure to the components of FIG. 1 are identified by adding 50 to the reference numerals of FIG. 1. For example, the storage regions in FIG. 1 are identified by referenced numeral 12; whereas the storage regions in FIG. 8 are identified by reference numeral 62.

Basically, the primary difference between the FIG. 8 embodiment and the FIG. 1 embodiment is that in the former, the bit lines 68 are formed by diffusions in the substrate; whereas in the latter, the bit lines 18 are formed by a conductor that overlies the substrate. To accommodate this change, the storage regions 62 are moved laterally away from the bit lines 68, and the transfer gates 69 are moved laterally toward the bit lines. Also, the openings 64 in the conductive layer 65 are extended to form not only the perimeter of the transfer channel, but also the perimeter of the bit lines 68.

The embodiment of FIG. 8 also has an A-C equivalent circuit as illustrated in FIG. 4. Further, it has a cross-section through its charge transfer gate as illustrated in FIG. 6. Accordingly, the FIG. 8 embodiment has all of the advantages which were previously described in conjunction with those two figures.

Figure 9:
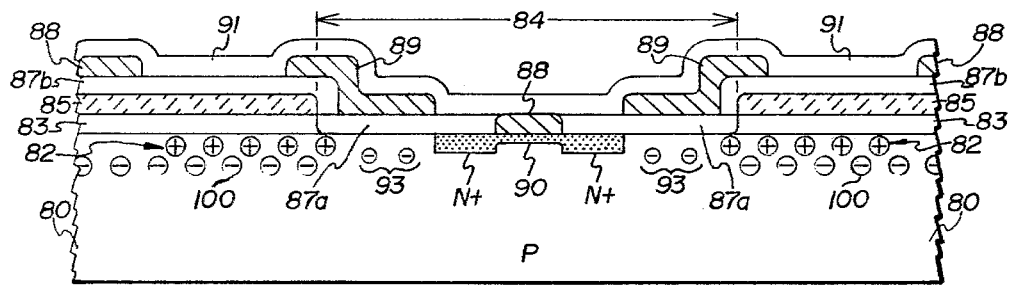
FIG. 9 is a cross-sectional view, taken along lines similar to 2—2, of a High-C version of the FIG. 1 embodiment.
Figure 10:
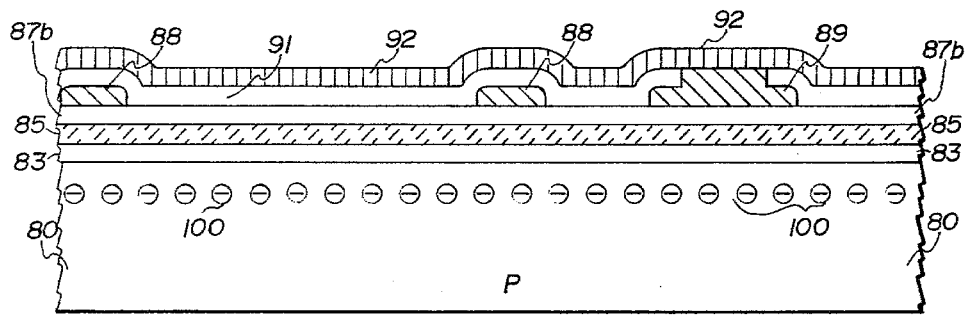
FIG. 10 is a cross-sectional view, taken along lines similar to 3—3, of a High-C version of the FIG. 1 embodiment.

Referring now to FIGS. 9 and 10, still another embodiment of the invention will be described. The components of this embodiment that are similar to the components of the FIG. 1 embodiment are identified by adding 70 to the reference numerals in FIG. 1. For example, the transfer gates 89 in FIG. 9 correspond to the transfer gates 19 in FIG. 1.

Basically, the embodiment of FIGS. 9 and 10 is a high capacity (High-C) version of the FIG. 1 embodiment. The increased storage capacity of each cell is achieved by providing a relatively deep layer 100 of P-type dopant impurity atoms throughout substrate 80 beneath conductor 85. That portion of layer 100 which lies beneath the storage region implants 82 operates to increase the junction capacitance of each cell as has been previously described in U.S. Pat. No. 4,125,933 issued Nov. 21, 1978 and assigned to Burroughs Corporation. All of the teachings of that patent are herein incorporated by reference.

In addition however, the embodiments of FIGS. 9 and 10 also incorporates those structural features of the FIG. 1 embodiment which eliminate narrow channel width effect and stabilize the substrate bias voltage. Thus, FIG. 4 is an A-C equivalence circuit of this embodiment, and FIG. 6 is also a cross-sectional view through transfer gate 89.

Various preferred embodiments of the invention have now been described in detail. In addition, several modifications and changes may be made to these details without departing from the nature and spirit of the invention. For example, a diffused bit line version of the high capacity embodiment may be constructed by moving the storage regions and transfer gates laterally with respect to the bit line as was described in conjunction with FIG. 8. In addition, the length of the openings in conductive layer 85 would be extended to define the perimeter of both the bit lines and the channel for the transfer gates.

As another variation, the P-type implants, the N-type implants, and the bias voltages may all be simultaneously reversed. This modification would result in holes (as opposed to electrons) being stored in the memory cells.

Therefore, since several such modifications are possible, it is to be understood that the invention is not limited to said details, but is defined by the appended claims.

What is claimed is:

1. A semiconductor memory comprised of:
   a semiconductor substrate having dopant impurity atoms of a first type and having a major surface;
   a plurality of spaced apart regions of dopant atoms of a second type opposite to said first type lying within a predetermined area on said surface defining storage regions for the cells of said memory;
   an insulating layer of substantially uniform thickness with a conductive layer lying thereon completely covering said predetermined area except for a plurality of elongated openings which extend outward from each of said storage regions; and
   a layer of dopant impurity atoms of said first type at substantially the same level as said storage regions throughout that portion of said substrate that lies beneath said conductive layer superimposed on said substrate doping;
   whereby the perimeter of a transfer channel having substantially no narrow channel width effect is defined from each storage region by said openings, and whereby a capacitor for stabilizing the voltage between said substrate and said conductive layer is formed by the combination of that portion of said insulating layer and conductive layer which lies between said storage regions.

2. A semiconductor memory according to claim 1 wherein said first type dopant impurity atoms are P-type and said second type dopant impurity atoms are N-type.

3. A semiconductor memory according to claim 1 wherein said first type dopant impurity atoms are N-type and said second type dopant impurity atoms are P-type.

4. A semiconductor memory according to claim 1 wherein said insulating layer consists of $SiO_2$, and said conductive layer consists of heavily doped polysilicon.

5. A semiconductor memory according to claim 1 wherein said layer of dopant atoms of said first type does not extend into said substrate beneath said openings, but lying therein is a separate layer of dopant atoms of said first type with a lower concentration density.

6. A semiconductor memory according to claim 1 wherein said layer of dopant atoms of said first type extends throughout said substrate beneath said openings, and also superimposed thereon is a separate layer of dopant atoms of said second type but of a lower concentration density.

7. A semiconductor memory according to claim 1 wherein said openings extend outward from said storage regions to define the perimeter of transfer gate regions and adjacent buried contact regions on the surface of said substrate.

8. A semiconductor memory according to claim 1 wherein said openings extend outward from said storage regions to define the perimeter of transfer gate regions and adjacent bit line regions on the surface of said substrate.

9. A semiconductor memory comprised of:
   a semiconductor substrate having dopant impurity atoms of a first type and having a major surface;
   a plurality of relatively shallow spaced apart regions of dopant atoms of a second type opposite to said first type lying within a predetermined area on said surface defining storage regions for the cells of said memory;
   an insulating layer of substantially unifrom thickness with a conductive layer lying thereon completely covering said predetermined area except for a plurality of elongated openings which extend outward from each of said storage regions; and
   a relatively deep layer of dopant impurity atoms of said first type throughout that portion of said substrate that lies beneath said conductive layer superimposed on said substrate doping;
   whereby the perimeter of a transfer channel having substantially no narrow channel width effect is defined from each storage region by said openings, and whereby a capacitor for stabilizing the voltage between said substrate and said conductive layer is formed by the combination of that portion of said insulating layer and conductive layer which lies between said storage regions.

10. A semiconductor memory according to claim 9 wherein said first type dopant impurity atoms are P-type and said second type dopant impurity atoms are N-type.

11. A semiconductor memory according to claim 9 wherein said first type dopant impurity atoms are N-type and said second type dopant impurity atoms are P-type.

12. A semiconductor memory according to claim 9 wherein said insulating layer consists of $SiO_2$, and said conductive layer consists of heavily doped polysilicon.

13. A semiconductor memory according to claim 9 wherein said layer of dopant atoms of said first type does not extend into said substrate beneath said openings, but lying therein is a separate layer of dopant atoms of said first type with a lower concentration density.

14. A semiconductor memory according to claim 9 wherein said layer of dopant atoms of said first type extends throughout said substrate beneath said openings, and also superimposed thereon is a separate layer of dopant atoms of said second type but of a lower concentration density.

15. A semiconductor memory according to claim 9 wherein said openings extend outward from said storage regions to define the perimeter of transfer gate regions and adjacent buried contact regions on the surface of said substrate.

16. A semiconductor memory according to claim 9 wherein said openings extend outward from said storage regions to define the perimeter of transfer gate regions and adjacent bit line regions on the surface of said substrate.

17. A memory cell comprised of:
   a semiconductor substrate having dopant atoms of a first type and having a major surface;
   a region of dopant atoms of a second type opposite to said first type lying in said surface defining the storage region for said cell;
   an insulating layer of substantially uniform thickness with a conductive layer lying thereon covering a predetermined area of said surface that includes and extends laterally from said storage region except for an elongated opening which extends outward from said storage region; and a layer of dopant atoms of said first type throughout that portion of said substrate that lies beneath said conductive layer at substantially the same depth as said region of second type atoms superimposed on said substrate doping.

18. A memory cell comprised of:

a semiconductor substrate having dopant atoms of a first type and having a major surface;

a relatively shallow region of dopant atoms of a second type opposite to said first type lying in said surface defining the storage region for said cell;

an insulating layer of substantially uniform thickness with a conductive layer laying thereon covering a predetermined area of said surface that includes and extends laterally from said storage region except for an elongated opening which extends outward from said storage region; and a relatively deep layer of dopant atoms of said first type throughout that portion of said substrate that lies beneath said conductive layer superimposed on said substrate doping.

19. An integrated circuit comprised of:

a semiconductor substrate having dopant atoms of a first type and having a major surface;

an insulating layer of substantially uniform thickness with a conductive layer lying thereon covering a predetermined area of said surface except for an opening within said area defining the perimeter of an active device; and a layer of dopant atoms of said first type throughout that portion of said substrate surface that lies beneath said conductive layer superimposed on said substrate doping;

whereby said insulating layer, conductive layer, and layer of dopant atoms form a capacitor to stabilize the substrate voltage of said active device.

20. An integrated circuit according to claim 19 wherein said opening is rectangular with a predetermined length/width ratio, and wherein said circuit further includes a conductive gate lying transverse to said opening on an insulating layer to define a MOS transistor as said active device.

* * * * *